(12) United States Patent
Lyu (10) Patent No.: US 6,219,114 B1
(45) Date of Patent: *Apr. 17, 2001

(54) LIQUID CRYSTAL DISPLAY DEVICE WITH REDUCED SOURCE/DRAIN PARASITIC CAPACITANCE AND METHOD OF FABRICATING SAME

(75) Inventor: Ki-Hyun Lyu, Kyungki-do (KR)

(73) Assignee: LG Electronics Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/910,338

(22) Filed: Aug. 13, 1997

Related U.S. Application Data (63) Continuation of application No. 08/566,287, filed on Dec. 1, 1995, now abandoned.

(51) Int. Cl.[7] .................. G02F 1/136; G02F 1/1343
(52) U.S. Cl. .................. 349/43; 349/42; 349/46; 349/48; 349/139; 349/143; 349/144; 349/148
(58) Field of Search .................. 359/59, 88; 257/204; 437/40, 41; 357/4; 349/42, 43, 46, 48, 139, 143, 144, 148

(56) References Cited

U.S. PATENT DOCUMENTS

| | | | |
|---|---|---|---|
| 4,778,773 | * 10/1988 | Sukegawa | 437/41 |
| 4,954,855 | * 9/1990 | Mimura et al. | 359/59 |
| 4,958,205 | * 9/1990 | Takeda et al. | 359/59 |
| 5,003,356 | * 3/1991 | Wakai et al. | 357/4 |
| 5,208,690 | * 5/1993 | Hayashi et al. | 359/59 |
| 5,283,449 | * 2/1994 | Ooka et al. | 257/204 |
| 5,327,001 | * 7/1994 | Wakai et al. | 359/59 |
| 5,432,108 | * 7/1995 | Lee | 437/40 |

FOREIGN PATENT DOCUMENTS

4253342 * 1/1991 (JP).

* cited by examiner

Primary Examiner—James A. Dudek
Assistant Examiner—Julie Ngo
(74) Attorney, Agent, or Firm—Morgan, Lewis & Bockius LLP

(57) ABSTRACT

A liquid crystal display device having a plurality of data lines and a plurality of gate lines arranged perpendicular to each other and a plurality of thin film transistors and pixel electrodes formed for respective pixels includes a substrate and a gate electrode on the substrate. A first insulating layer is formed on the substrate and the gate electrode. An active layer is formed on the first insulating layer and an etch stop layer is formed on the active layer over the gate electrode. A silicide layer having first and second sides relative to the second insulating layer is formed on the surface of the active layer and a metal electrode is formed on the first side of the silicide layer. A pixel electrode is formed on the second side of the silicide layer and a third insulating layer is formed having a portion directly on the silicide layer.

27 Claims, 11 Drawing Sheets

LIQUID CRYSTAL DISPLAY DEVICE WITH REDUCED SOURCE/DRAIN PARASITIC CAPACITANCE AND METHOD OF FABRICATING SAME

This application is a continuation of application Ser. No. 08/566,287, filed Dec. 1, 1995, now abandoned.

BACKGROUND OF THE INVENTION

1. Field of the Invention

The present invention relates to a liquid crystal display device, and more particularly, to a liquid crystal display having a thin film transistor and a pixel electrode.

2. Discussion of the Related Art

Generally, a thin film transistor-liquid crystal display (TFT-LCD) includes a bottom plate on which a thin film transistor and a pixel electrode are arranged and a top plate on which a color filter for displaying colors and a common electrode are formed. Liquid crystal is filled between the bottom and top plates.

Figure 1:
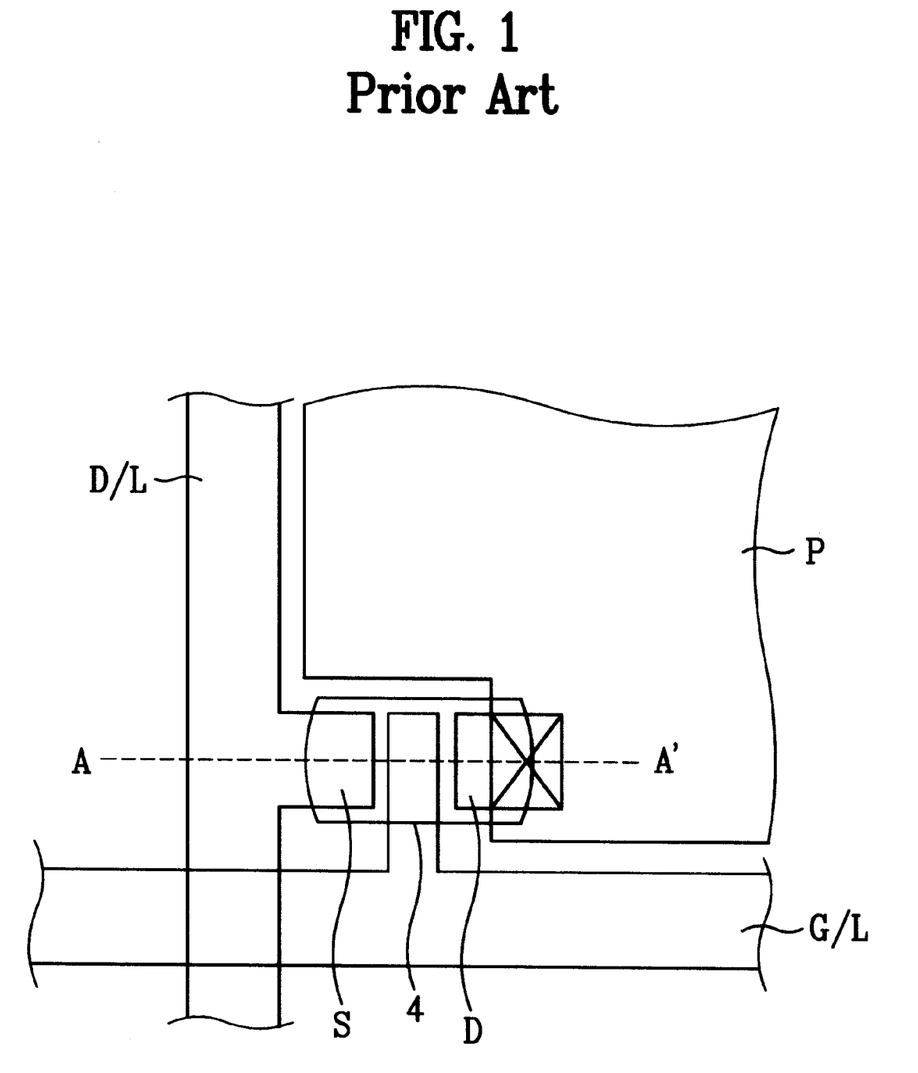
FIG. 1 is a layout of a conventional liquid crystal display.

FIG. 1 is a layout of a thin film transistor and a pixel electrode arranged on the bottom plate of a conventional liquid crystal display.

Referring to FIG. 1, a gate line G/L is arranged in the horizontal direction, and a data line D/L is arranged in the vertical direction. A thin film transistor is formed at an intersection where gate line G/L and data line D/L meet. Gate line G/L is used as a gate electrode G of the thin film transistor and data line D/L as its source electrode S. A pixel electrode P is coupled to a drain electrode D of the thin film transistor.

A conventional structure of a thin film transistor and a pixel electrode of a liquid crystal display and a method of fabricating the same will be discussed below with reference to the accompanying drawings.

FIGS. 2A–2F are cross-sectional views of a sequential manufacturing process of the thin film transistor and pixel electrode of the conventional liquid crystal display, taken along line A—A' of FIG. 1.

Figure 2A:
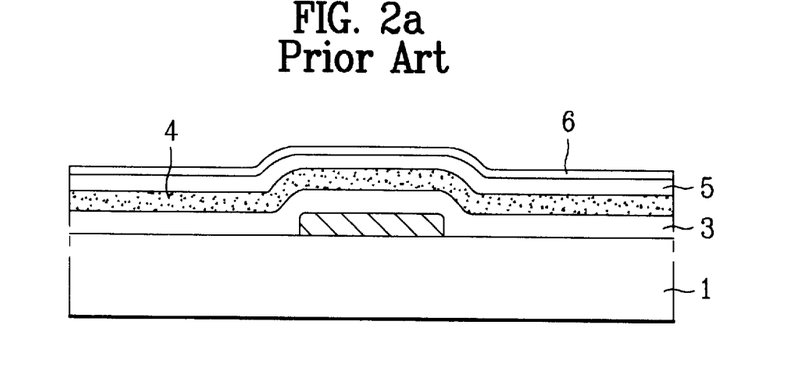
FIGS. 2A–2F are cross-sectional views of the conventional liquid crystal display, taken along line A—A' of FIG. 1 and showing the sequence of the manufacturing process.

First, as shown in FIG. 2A, a gate electrode 2 is formed on a glass substrate 1. Then a gate insulating layer 3, amorphous silicon layer 4, n+amorphous silicon layer 5, and Cr layer 6 are sequentially formed on the overall surface of substrate 1 including gate electrode 2.

Figure 2B:
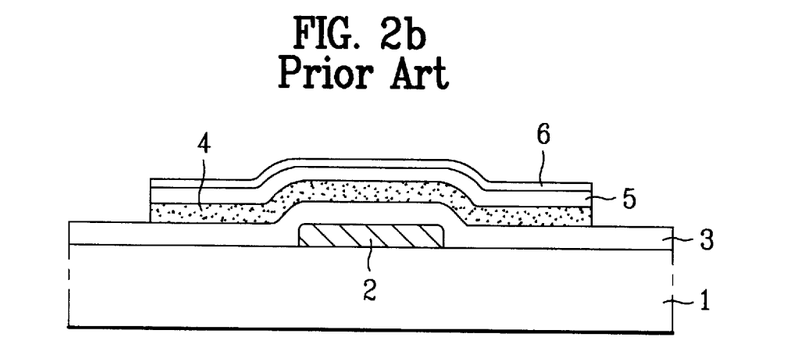

Next, as shown in FIG. 2B, the active region of the thin film transistor is defined so that amorphous silicon layer 4, n+amorphous silicon layer 5, and Cr layer 6 are selectively removed such that these layers remain only on the active region and over what will become the source and drain regions. A Cr silicide layer 7 is formed between Cr layer 6 and n+amorphous silicon layer 5 by annealing the resultant structure between 150 and 300° C. for 30–60 minutes.

Figure 2C:
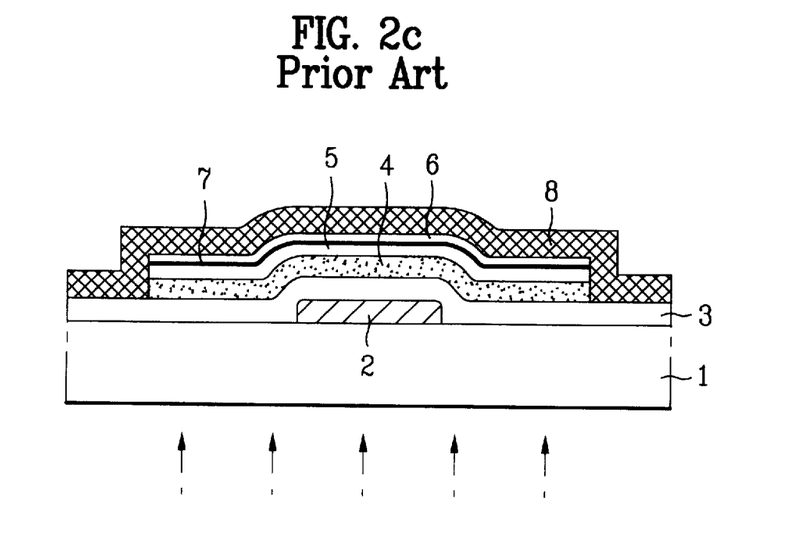
Figure 2D:
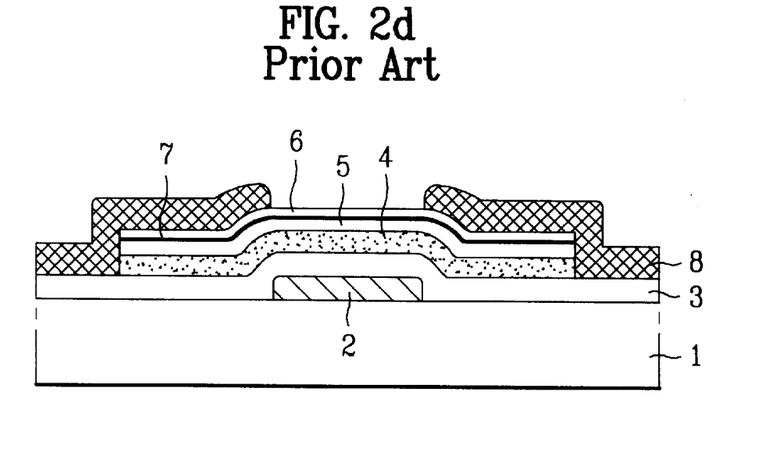

As shown in FIG. 2C, a negative-type photoresist 8 is coated on the overall surface of the substrate including the Cr silicide layer 7, and back-side exposure and development are performed using gate electrode 2 as a mask. Then, as shown in FIG. 2D, photoresist 8 coated on gate electrode 2 is removed selectively to expose a portion of the Cr silicide layer 7.

Figure 2E:
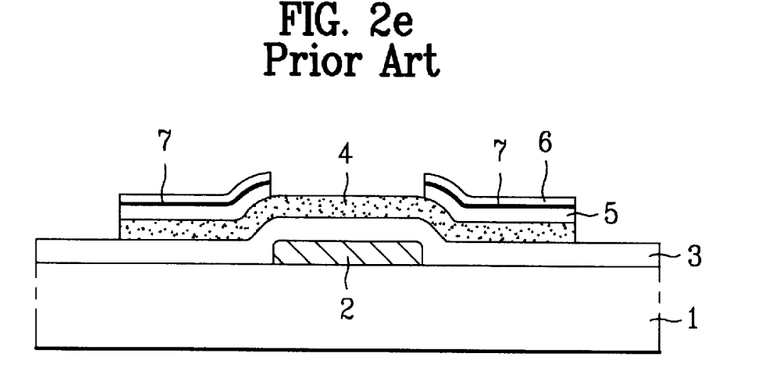

As shown in FIG. 2E, exposed Cr silicide layer 7 and n+amorphous silicon layer 5 are sequentially removed using the remaining photoresist 8 as a mask. Photoresist 8 is also removed.

Figure 2F:
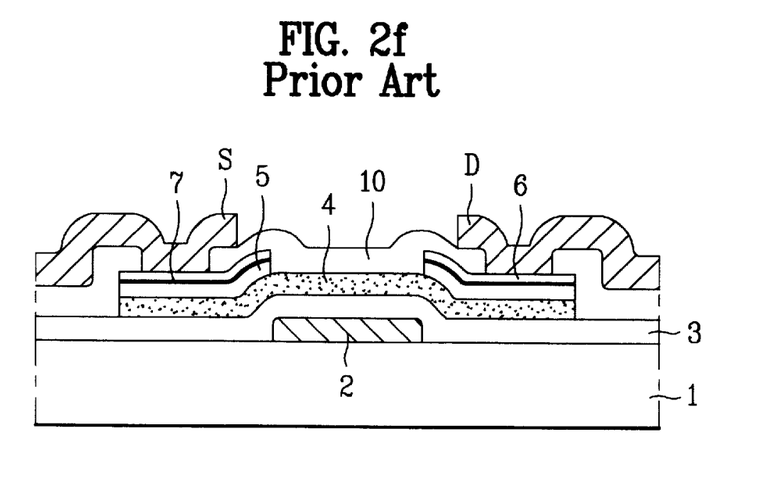

Next, as shown in FIG. 2F, a nitride 10 is deposited on the overall surface of the substrate, and a contact hole is formed on Cr silicide layer 7. A source electrode S and drain electrode D are formed to come into contact with Cr silicide layer 7 through the contact hole. A pixel electrode P (not shown) is formed to come into contact with drain electrode D.

However, the conventional liquid crystal display formed by the aforementioned method has the following problems.

First, the substrate is bent due to stress caused by compression during deposition of the metal layer, and the aperture ratio is reduced as much as the region occupied by the metal layer, because the metal layer is formed on the drain electrode (or source electrode) of the thin film transistor, which is coupled to the pixel electrode.

Second, steps or levels are formed because the source/drain electrodes of the thin film transistor are formed of metal and the pixel electrode contacts the source/drain electrodes from above.

Third, metal deposition processes for forming the silicide and source/drain electrodes are performed separately, complicating the overall manufacturing procedure.

Fourth, a drain electrode made of metal is formed in the drain region of the thin film transistor, reducing the aperture ratio.

SUMMARY OF THE INVENTION

Accordingly, the present invention is directed to a liquid crystal display device and method of fabricating the same that substantially obviates one or more of the problems due to limitations and disadvantages of the related art.

It is an object of the present invention to provide a liquid crystal display and method of fabricating the same, for improving the aperture ratio, reducing stress caused by metal, and decreasing the number of steps.

Additional features and advantages of the invention will be set forth in the description which follows, and in part will be apparent from the description, or may be learned by practice of the invention. The objectives and other advantages of the invention will be realized and attained by the structure particularly pointed out in written description and claims hereof as well as the appended drawings.

To achieve these and other advantages and in accordance with the purpose of the invention, as embodied and broadly described, the invention includes a liquid crystal display device including a substrate; a gate electrode on the substrate; a first insulating layer on the substrate and the gate electrode; an active layer on the first insulating layer; a second insulating layer on the active layer over the gate electrode; a silicide layer having first and second sides relative to the second insulating layer on the surface of the active layer; a pixel electrode on the first side of the silicide layer; and a third insulating layer directly over the second side of the silicide layer.

In another aspect, the invention includes a liquid crystal display device including a substrate; a gate electrode on the substrate; a first insulating layer on the substrate and the gate electrode; an active layer on the first insulating layer; a second insulating layer on the active layer over the gate electrode; a silicide layer having first and second sides relative to the second insulating layer on the surface of the active layer; a third insulating layer directly over the second insulating layer, the third insulating layer having a contact hole to the silicide layer at a first side of the silicide layer; and a pixel electrode on the third insulating layer at the first side of the silicide layer, the pixel electrode contacting the silicide layer through the contact hole.

In another aspect, the invention includes a liquid crystal display device including a substrate; a gate electrode on the substrate; a first insulating layer on the substrate and the gate electrode; an active layer on the first insulating layer; a second insulating layer on the active layer over the gate electrode; a silicide layer having first and second sides relative to the second insulating layer on the surface of the active layer; a metal layer on the second side of the silicide layer; a third insulating layer on the metal layer, second insulating layer, and directly on the first side of the silicide layer, the third insulating layer having a contact hole at the first side of the silicide layer; and a pixel electrode on the third insulating layer at the first side of the silicide layer, the pixel electrode contacting the silicide layer through the contact hole.

In another aspect, the present invention includes a liquid crystal display device having a plurality of data lines and a plurality of gate lines arranged perpendicular to each other and a plurality of thin film transistors and pixel electrodes formed for respective pixels, the liquid crystal display device including a substrate; a gate electrode on the substrate; a first insulating layer on the substrate and the gate electrode; an active layer on the first insulating layer; an etch stop layer on the active layer over the gate electrode; a silicide layer having first and second sides relative to the second insulating layer on the surface of the active layer; a metal electrode on the first side of the silicide layer; a pixel electrode on the second side of the silicide layer; and a third insulating layer having a portion directly on the silicide layer.

In a further aspect, the present invention includes a method of fabricating a liquid crystal display device having a plurality of data lines and a plurality of gate lines arranged perpendicular to each other and a plurality of thin film transistors and pixel electrodes formed at respective pixels, the method comprising the steps of providing a substrate; forming a first electrode on the substrate; sequentially forming a first insulating layer, a semiconductor layer, and a second insulating layer over the substrate and the gate electrode; forming an etch stop layer from the second insulating layer using the gate electrode as a mask; forming an active layer from the semiconductor layer using an active layer pattern mask; depositing metal over the surface of the substrate to form a silicide layer on an exposed surface of the active layer at sides of the etch stop layer; forming a metal electrode pattern on the data lines and on a first side of the silicide layer by selectively removing the metal layer; and forming a pixel electrode coupled to a second side of the silicide layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Preferred embodiments of the present invention will be explained below with reference to the accompanying drawings.

Figure 3:
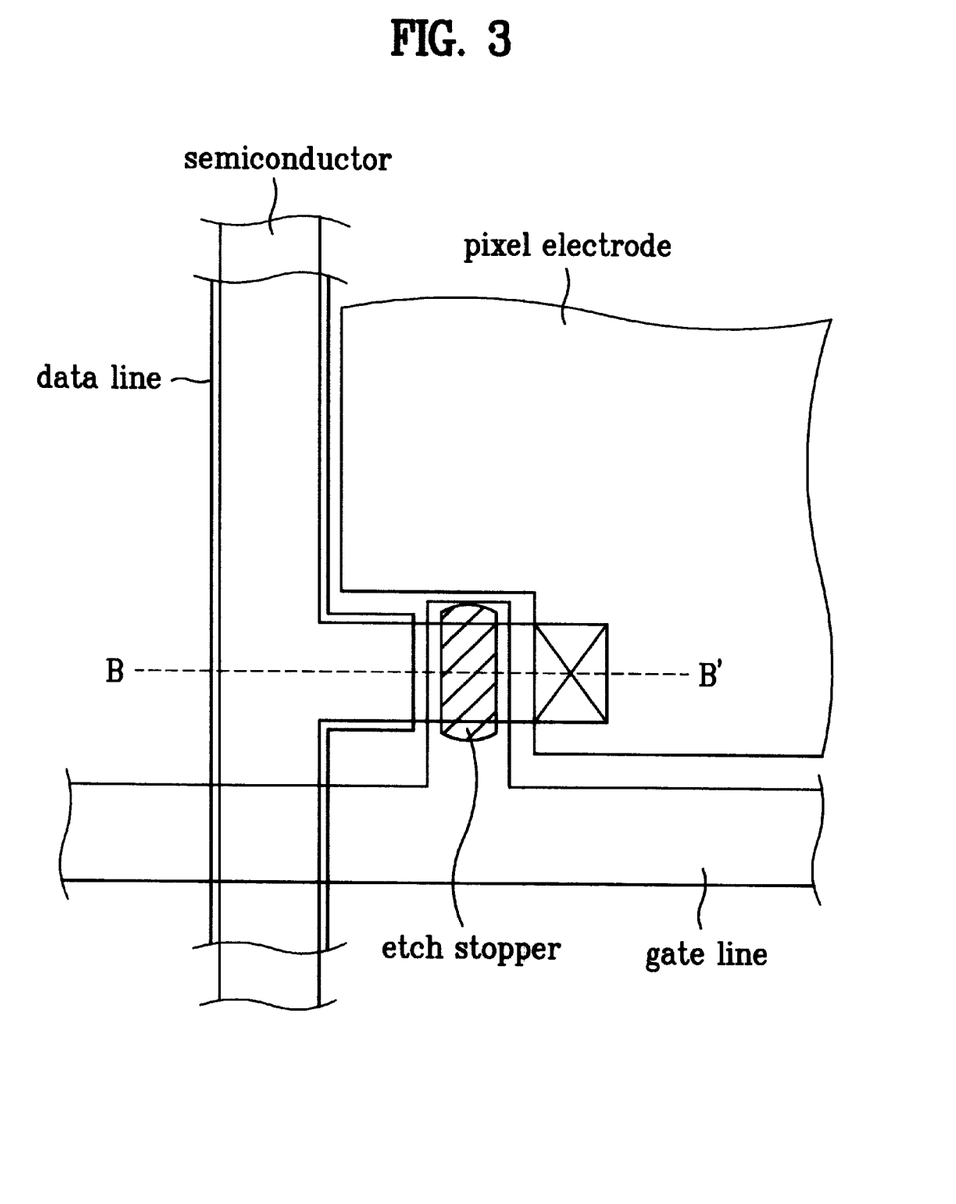
FIG. 3 is a layout of a liquid crystal display in accordance with the present invention.

Referring to FIG. 3, a gate line G/L is arranged in the horizontal direction and a data line D/L is arranged in the vertical direction. A thin film transistor is formed at an intersection of the gate line G/L and data line D/L.

In FIG. 3, a metal electrode is not formed on the drain region of the thin film transistor, and a semiconductor layer (active layer) is formed below the data line.

A method of fabricating the liquid crystal display according to the first embodiment of the present invention will be explained below.

Figure 4A:
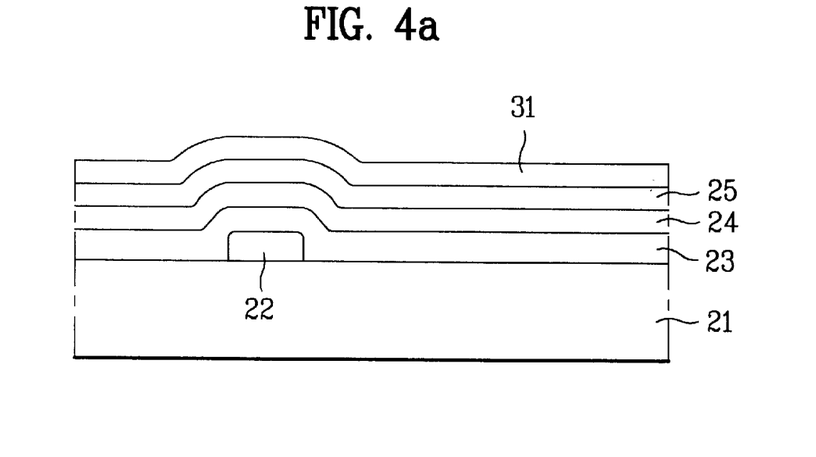
FIGS. 4A–4H are cross-sectional views of a liquid crystal display in accordance with the first embodiment of the present invention, taken along line B—B' of FIG. 3 and showing the sequence of the manufacturing process.

First, as shown in FIG. 4A, a gate electrode 22 is formed on a glass substrate 21. A gate insulating layer 23 made of a material such as silicon nitride is formed on the entire surface of the substrate and gate electrode. Amorphous silicon layer 24, an insulating layer 25 made of a material such as a silicon nitride, and a first photoresist layer 31 are sequentially formed over the overall surface of glass substrate 21 including gate electrode 22.

Figure 4B:
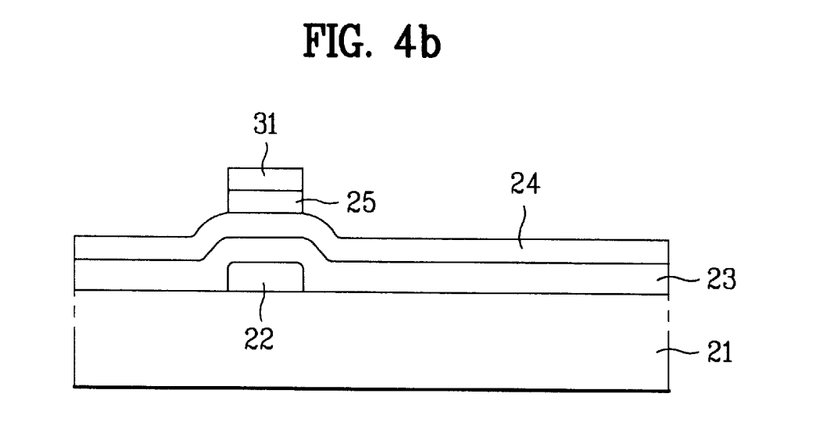
Figure 4C:
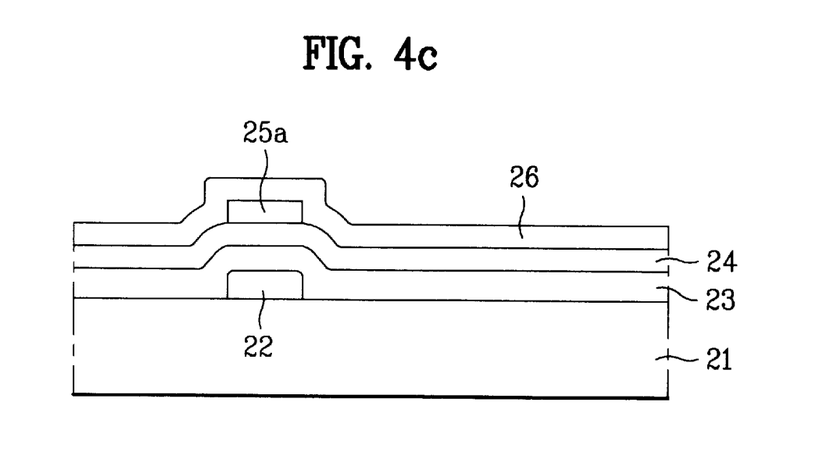

As shown in FIG. 4B, insulating layer 25 is selectively etched by back-side exposure and etch process using gate electrode 22 as a mask, to form an etch stop layer 25a (FIG. 4C).

First photoresist layer 31 is removed.

Figure 4D:
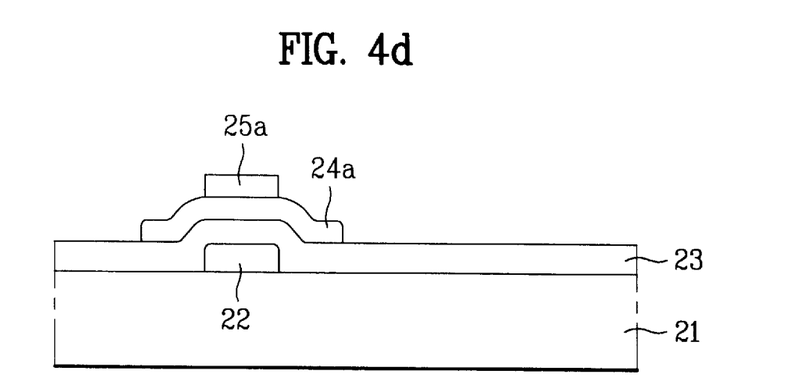
Figure 4E:
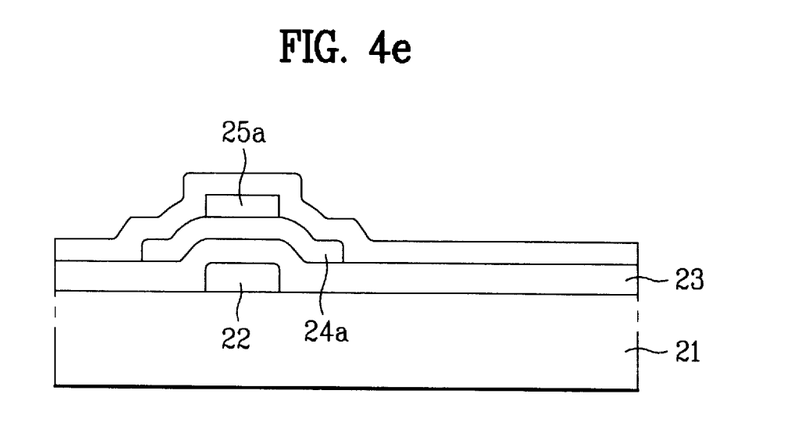

Next, as shown in FIG. 4C, a second photoresist layer 26 is formed on the overall surface of the substrate on which etch stop 25a is formed. Then, as shown in FIG. 4D, amorphous silicon layer 24 is selectively removed through photolithography using an active region pattern mask (not shown), to form an active layer 24a (FIG. 4E). Second photoresist layer 26 is removed. Here, active layer 24a remains at a portion where a data line will be formed, as well as on the active region of the thin film transistor.

As shown in FIG. 4e, a refractory metal layer 27, including, for example, Cr or W, is deposited on the overall surface of gate insulating layer 23 including etch stop layer 25a and active layer 24a. A metal silicide layer 28 is formed between the refractory metal layer 27 and the active layer 24a by reacting the material of the refractory metal layer 27 and the silicon of the active layer 24a in a portion where the active layer 24a and the refractory metal layer 27 contact each other. At this time, the refractory metal layer 27 has not entirely reacted with the silicon of the active layer 24a, and a portion of the refractory metal 27 remains unreacted.

Figure 4F:
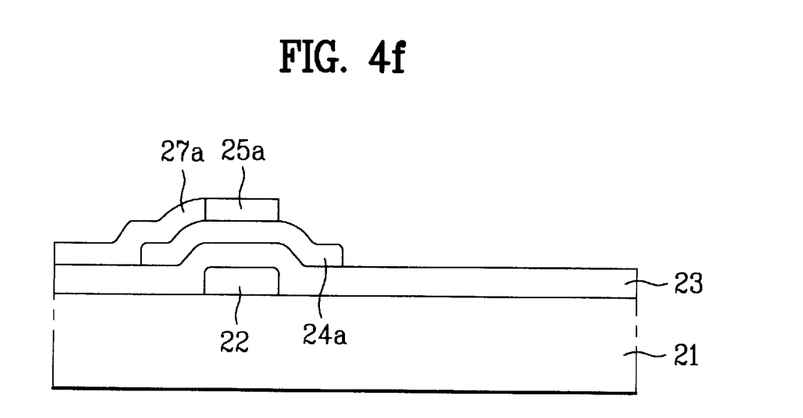

Then, as shown in FIG. 4f, the remaining refractory metal layer 27 on one side of the gate electrode 22 (i.e, on the right side in this figure) is selectively removed by photolithography, leaving metal pattern 27a (for forming a data line and a source electrode) on the left side of FIG. 4f, where the metal pattern 27a is in contact with the left portion of the silicide layer 28.

Figure 4G:
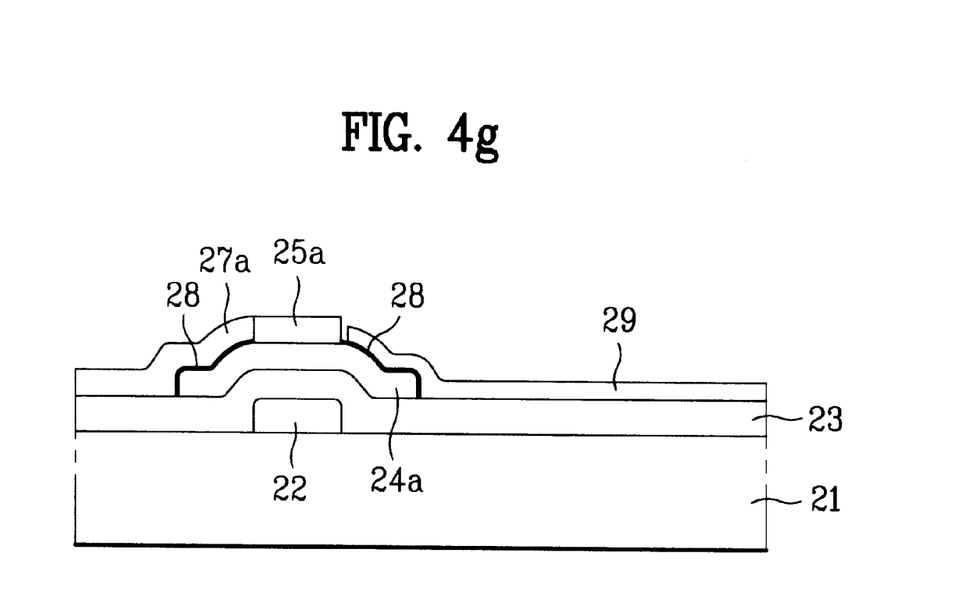
Figure 4H:
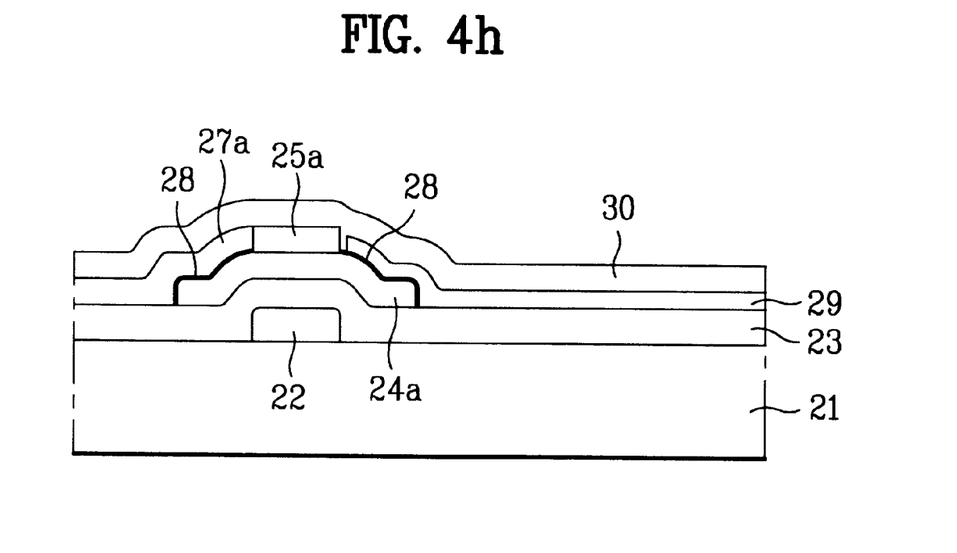

As shown in FIG. 4G, a pixel electrode 29 is formed to be coupled to metal silicide layer 28 at the drain region of the thin film transistor where unreacted refractory metal layer 27 is selectively removed by using a photo-resist (now shown) as a mask. Next, as shown in FIG. 4H, a protective layer 30 is formed on the overall surface of the substrate.

Figure 5A:
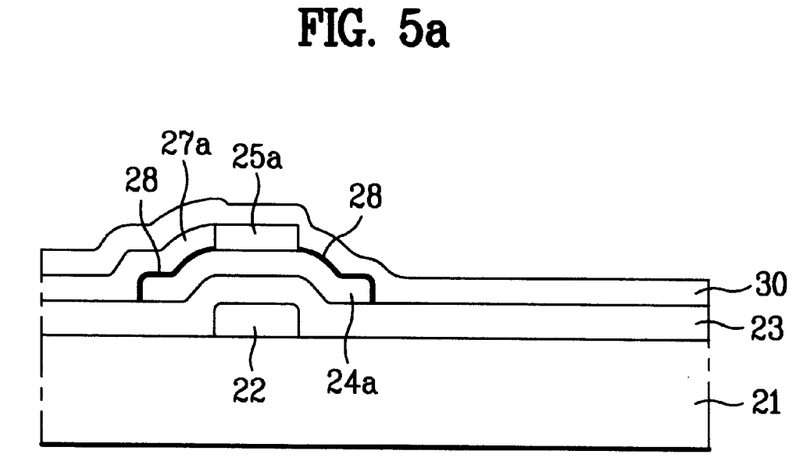
FIGS. 5A and 5B are cross-sectional views of a liquid crystal display in accordance with the second embodiment of the present invention, taken along line B—B' of FIG. 3 and showing the sequence of the manufacturing process.
Figure 5B:
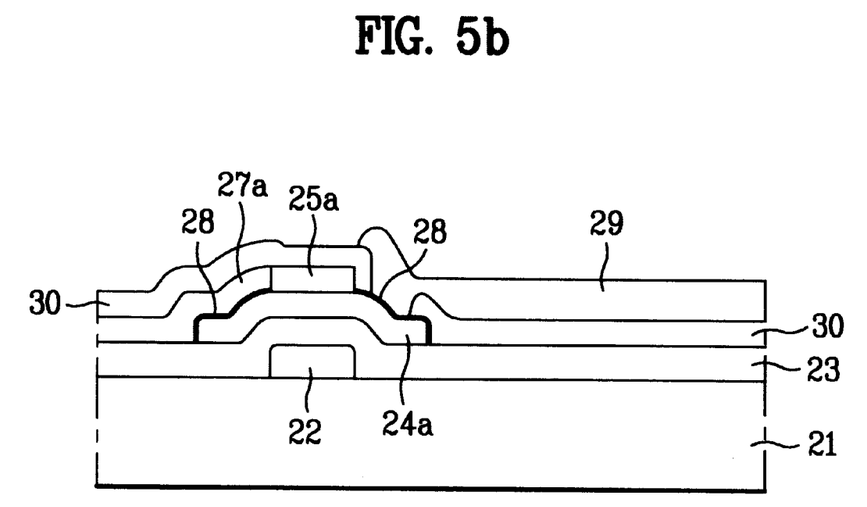

The second embodiment of the present invention is shown in FIGS. 5A and 5B. The process steps for the second embodiment follows the steps for the first embodiment. However, after the process shown in FIG. 4F, protective layer 30 is formed on the overall surface of the substrate, as shown in FIG. 5A. Then, as shown in FIG. 5B, a contact hole is formed to expose a portion of the metal silicide layer 28 in the drain region. Pixel electrode 29 is formed over the protective layer 30 and contacts the metal silicide layer 28 through the contact hole.

Figure 6A:
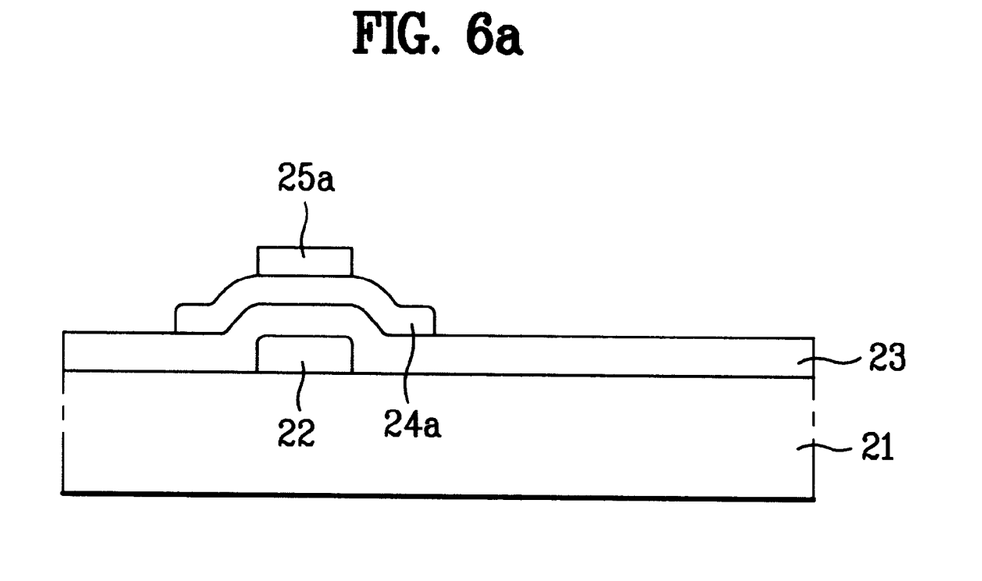
FIGS. 6A and 6B are cross-sectional views of a liquid crystal display in accordance with the third embodiment of the present invention, taken along line B—B' of FIG. 3 and showing the sequence of the manufacturing process.
Figure 6B:
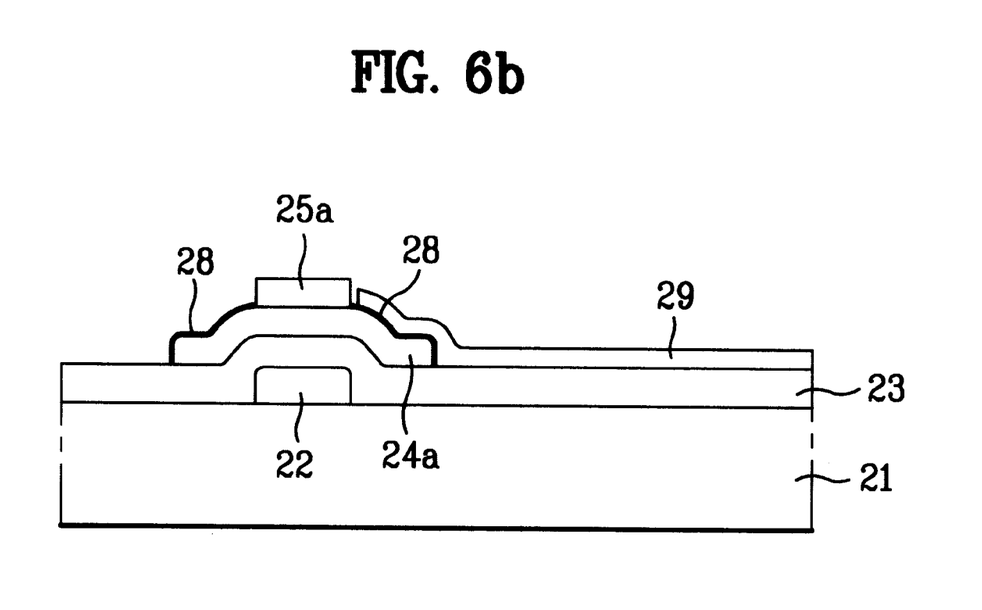

The third embodiment of the present invention is shown in FIGS. 6A and 6B. The process steps for the third embodiment follows the steps for the first embodiment. However, after the process shown in FIG. 4E, the refractory metal layer 27 is removed, as shown in FIG. 6A. Thus, metal silicide layer 28 remains after the metal is removed. Then, pixel electrode 29 is formed over one side of the metal silicide layer 28, as shown in FIG. 6B. A protective layer (not shown) is formed on the overall surface of the substrate, similar to the first embodiment.

Figure 7:
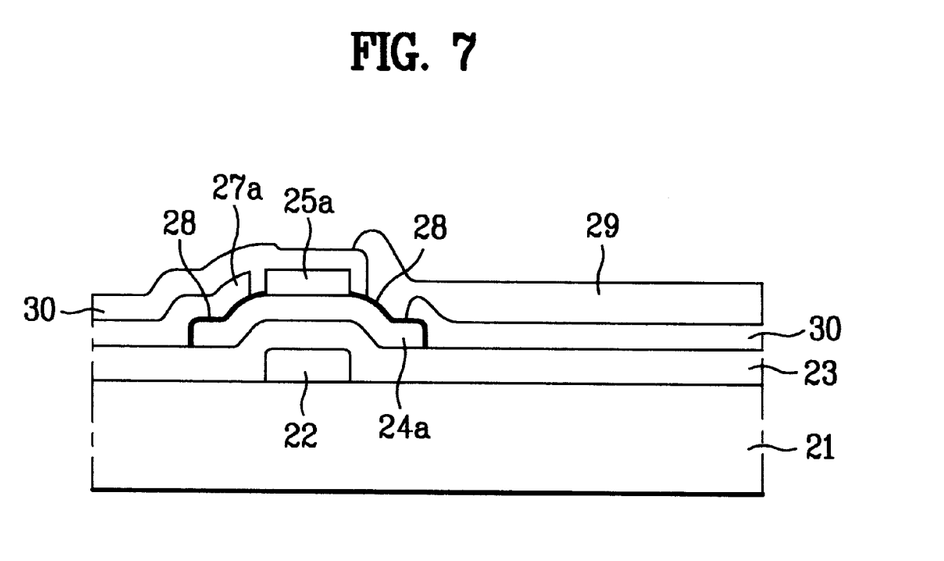
FIG. 7 is a cross-sectional view of a liquid crystal display in accordance with the fourth embodiment of the present invention, taken along line B—B' of FIG. 3 and showing the sequence of the manufacturing process.

The fourth embodiment of the present invention is similar to the second embodiment. In the fourth embodiment, however, the metal electrode 27a does not entirely cover the metal silicide 28, as shown in FIG. 7. Thus, a portion of the protective layer contacts the metal silicide 28 through a region between the metal electrode 27a and the etch stop layer 25a, as shown in the cross-sectional view of FIG. 7.

Figure 8A:
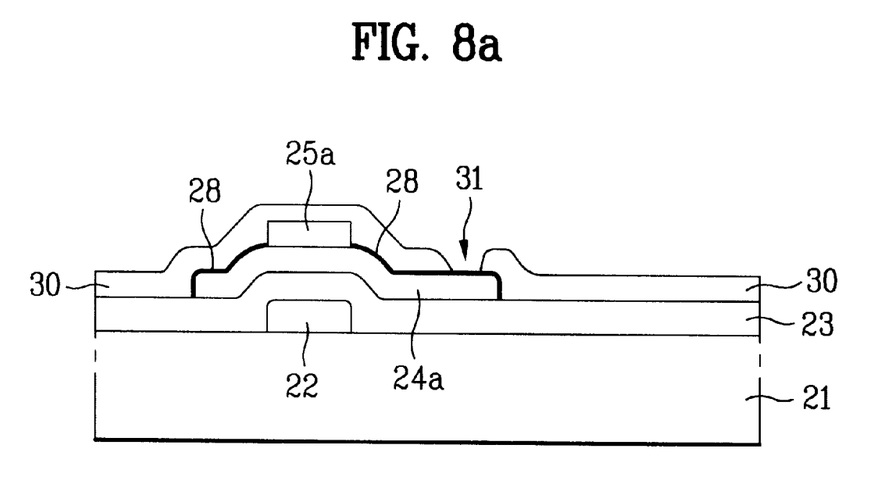
FIGS. 8A and 8B are cross-sectional views of a liquid crystal display in accordance with the fifth embodiment of the present invention, taken along line B—B' of FIG. 3 and showing the sequence of the manufacturing process.
Figure 8B:
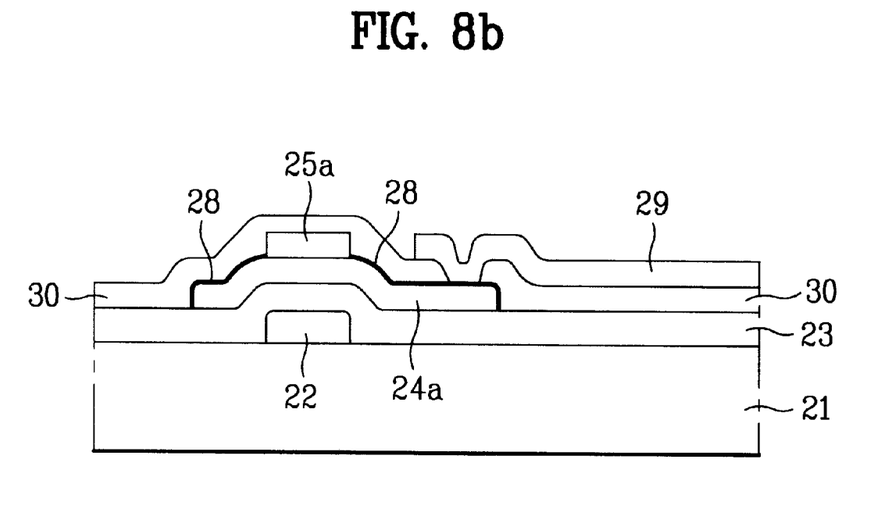

The fifth embodiment of the present invention also follows the steps for the first embodiment. However, after the process shown in FIG. 4E, the refractory metal layer 27 is removed (similar to FIG. 6A in the third embodiment). Thus, metal silicide layer 28 remains after the metal is removed (i.e., no metal pattern 27a shown in FIG. 4f remains either). Then, a protective layer 30 is formed on the gate insulating layer 23, metal silicide layer 28, and etch stop layer 25a, as shown in FIG. 8a. A contact hole 31 is formed in the protective layer 30 to expose the metal silicide layer 28. Then, pixel electrode 29 is formed over the protective layer 30 and contacts the metal silicide layer 28 through the contact hole 31, as shown in FIG. 8B.

The structure of the liquid crystal display according to the present invention manufactured by aforementioned fabricating methods is shown in FIGS. 4H, 5B, 6B, 7 and 8B, respectively.

Gate electrode 22 is formed on glass substrate 21, and the gate insulating layer 23 is formed on the overall surface of the structure including gate electrode 22.

Active layer 24a is formed on gate insulating layer 23, and the etch stop layer 25a is formed on the active layer 24a.

The etch stop layer 25a has a width substantially the same as that of gate electrode 22 and is aligned with the gate electrode 22.

Metal silicide layer 28 is formed on the surface of both sides of active layer 24a exposed by etch stop layer 25a. Metal electrode 27a (for the first, second, and fourth embodiments) is formed on one side of metal silicide layer 28, and pixel electrode 29 is formed on the other side of metal silicide layer 28.

As described above, in the liquid crystal display in accordance with the present invention, a metal electrode is not formed on the drain region, which improves the aperture ratio, reduces the stress caused by the metal electrode, and decreases the steps caused due to a pixel electrode.

In addition, according to the present invention, the metal layer, which is deposited to form a metal silicide, is used as an electrode (for the first, second, and fourth embodiments), simplifying the overall procedure.

Furthermore, parasitic capacitance between the source/drain region and gate electrode is reduced because, in forming a silicide, an etch stop is formed having the same width and in the same relative position as that of the gate electrode. This improves the characteristic of the liquid crystal display.

It will be apparent to those skilled in the art that various modifications and variations can be made in the liquid crystal display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:

a substrate;

a gate electrode on the substrate;

a first insulating lays on the substrate and the gate electrode;

an active layer on the first insulating layer;

a second insulating layer on the active layer over the gate electrode and having approximately the same width as the gate electrode;

a silicide layer directly on the active layer and having first and second sides relative to the second insulating layer on an exposed surface of the active layer, the first and second sides of the silicide layer acting as source and drain electrodes, respectively;

a metal patter only on the second side of the silicide layer;

a pixel electrode on the first side of the silicide layer; and a third insulating layer over the second side of the silicide layer, a portion of the third insulating layer covering the second insulating layer, wherein the silicide layer is formed by reacting a metal material with a material of the active layer, wherein data line is formed from the metal pattern by selectively removing any reacted portion of the metal pattern on the first side of the silicide layer, and wherein any unreacted material of the metal pattern on the second insulating layer and the first insulating layer next to the first side of the silicide layer is selectively removed.

2. The liquid crystal display device according to claim 1, wherein the second insulating layer is an etch stop layer.

3. The liquid crystal display device according to claim 2, wherein the etch stop layer is aligned with the gate electrode.

4. The liquid crystal display device of claim 1, wherein the third insulating layer also contacts the first insulating layer.

5. The liquid crystal display device of claim 1, wherein the silicide layer includes tungsten.

6. A liquid crystal display device comprising:

a substrate;

a gate electrode on the substrate;

a first insulating layer on the substrate and the gate electrode;

an active layer an the first insulating layer;

a second insulating layer on the active layer over the gate electrode and having approximately the same width as the gate electrode;

a silicide layer having first and second sides relative to the second insulating layer on an exposed surface of the active layer, the first and second sides of the silicide layer acting as source and drain electrodes, respectively;

a metal pattern only on the second side of the silicide layer;

a third insulating layer over the second insulating layer, the third insulating layer having a contact hole leading to the side layer at the first side of the silicide layer, the third insulating layer covering the second insulating layer and a portion of the first insulating layer; and a pixel electrode on the third insulating layer at the first side of the silicide layer, the pixel electrode contacting the silicide layer through the contact hole, wherein the silicide layer is formed by reacting a metal material with a material of the active layer, wherein a data line is formed from the metal pattern by selectively removing any unreacted portion of the metal pattern on the first side of the silicide layer, and wherein any unreacted material of the metal pattern on the second insulating layer and the first insulating layer next to the first side of the silicide layer is selectively removed.

7. The liquid crystal display device according to claim 6, wherein the second insulating layer is an etch stop layer.

8. The liquid crystal display device according to claim 7, wherein the etch stop layer is aligned with the gate electrode.

9. The liquid crystal display device of claim 6, wherein the silicide layer includes tungsten.

10. A liquid crystal display device comprising:

a substrate;

a gate electrode on the substrate;

a first insulating layer on the substrate and the gate electrode;

an active layer over the first insulating layer;

a second insulating layer on the active layer over the gate electrode and having approximately the same width as the gate electrode;

a silicide layer directly on the ac layer and having first and second sides relative to the second insulating layer on an exposed surface of the active layer the firs side of the silicide layer acting as one of source and drain electrodes;

a metal layer only on the second side of the silicide layer;

a third insulating layer on the metal layer, the second insulating layer, and directly on the first side of the silicide layer, the third insulating layer having a contact hole at the first side of the suicide layer and covering the second insulating layer and a portion of the first insulating layer; and a pixel electrode on the third insulating layer at the first side of the silicide layer, the pixel electrode contacting the silicide layer through the contact hole, wherein the silicide layer is formed by reacting a metal material of the active layer, wherein a data line is formed from the metal layer by selectively removing any unreacted portion of the metal layer on the first side of the silicide layer, and wherein any unreacted material of the metal layer on the second insulating layer and the first insulating layer next to the first side of the silicide layer is selectively removed.

11. The liquid crystal display device according to claim 10, wherein the second insulating layer is an etch stop layer.

12. The liquid crystal display device according to claim 11, wherein the etch stop layer is aligned with the gate electrode.

13. The liquid crystal display device according to claim 10, wherein the metal layer is a refractory metal layer.

14. The liquid crystal display device of claim 10, wherein the silicide layer includes tungsten.

15. A liquid crystal display device having a plurality of data lines and a plurality of gate lines arranged perpendicular to each other and a plurality of thin film transistors and pixel electrodes formed for respective pixels, the liquid crystal display device comprising:

a substrate;

a gate electrode on the substrate;

a gate insulating layer on the substrate and the gate electrode;

an active layer on the gate insulating layer;

an etch stop layer on the active layer over the gate electrode and having approximately the same width as the gate electrode;

a silicide layer directly on the active layer and having first and second aides relative to the etch stop layer on an exposed surface of the active layer, the first side of the silicide layer acting as one of the source and drain electrodes;

a metal electrode only on the second side of the silicide layer;

a pixel electrode on the first side of the silicide layer; and a protective layer having a portion directly on the silicide layer the etch stop layer and the gate insulating layer, the protective layer having a contact hole for the pixel electrode to contact the first side of the silicide layer, wherein the side layer is formed by reacting a metal material with a material of the active layer, wherein a data line is formed from the metal electrode by selectively removing any unreacted portion of the metal electrode on the first side of the silicide layer, and wherein any unreacted material of the metal electrode on the etch stop layer and the first insulating layer next to the first side of the silicide layer is selectively removed.

16. The liquid crystal display device according to claim 15, wherein the etch stop layer is aligned with the gate electrode.

17. The liquid crystal display device of claim 15, wherein the silicide layer includes tungsten.

18. A method of fabricating a liquid crystal display device having a plurality of data lines and a plurality of gate lines arranged perpendicular to each other and a plurality of thin film transistors and pixel electrodes formed at respective pixels, the method comprising the steps of:

forming a gate electrode on a substrate;

sequentially forming a first insulating layer, a semiconductor layer, and a second insulating layer over the substrate and the gate electrode;

forming an etch stop layer from the second insulating layer using the gate electrode as a mask and having approximately the same width as the gate electrode;

forming an active layer from the semiconductor layer using an active layer pattern mask;

depositing a metal layer on the active layer the etch stop layer and the first insulating layer;

forming a silicide layer at a boundary between the active layer and the metal layer by reacting a material of the metal layer with a material of the active layer, the silicide layer having first and second sides relative to the etch stop layer on an exposed surface of the active layer;

patterning the metal layer to form a data line by selectively removing any unreacted portion of the metal layer on the first side of the silicide layer;

selectively removing any unreacted material of the metal layer on the etch stop layer and the first insulating layer next to the first side of the silicide layer:

forming a pixel electrode on the first side of the silicide layer; and forming a third insulating layer over the substrate and the gate electrode, the third insulating layer covering the etch stop layer and a portion of the first insulating layer.

19. The method according to claim 18, wherein the etch stop forming step includes the step of selectively removing the insulating layer through back-side exposure and etch process.

20. The method according to claim 18, wherein the active layer forming step includes the step of selectively removing the semiconductor layer through photolithography.

21. The method according to claim 18, wherein the etch stop forming step includes the steps of forming a photoresist layer and selectively removing the insulating layer using the photoresist layer.

22. The method according to claim 18, wherein the active layer forming step includes the steps of forming a photoresist layer and selectively removing the semiconductor layer using the photoresist layer.

23. The method according to claim 18, wherein the etch stop forming step includes the step of aligning the etch stop over the gate electrode.

24. The liquid crystal display device of claim 18, wherein the silicide layer includes tungsten.

25. A method of fabricating a liquid crystal display device having a plurality of data lines and a plurality of gate lines arranged perpendicular to each other and a plurality of thin film transistors and pixel electrodes formed at respective pixels, the method comprising the steps of:

forming a gate electrode on a substrate;

sequentially forming a first insulating layer, a semiconductor layer, and a second insulating layer over the substrate and the gate electrode;

forming an etch stop layer from the second insulating layer using the gate electrode as a mask and having approximately the same width as the gate electrode;

forming an active layer from the semiconductor layer using an active layer pattern mask;

depositing a metal layer on the active layer, the etch stop layer and the first insulating layer;

reacting a material of the metal layer and a material of the active layer to form a silicide layer at a boundary between the active layer and the metal layer, the silicide layer having first and second sides relative to the etch stop layer on an exposed surface of the active layer, wherein the silicide layer is formed directly on the active layer;

patterning the metal layer to form a data line by selectively removing any unreacted material of the metal layer on the first side of the silicide layer;

selectively removing any unreacted material of the metal layer on the etch stop layer and the first insulating layer next to the first side of the silicide layer; and forming a third insulating layer over the substrate and the gate electrode, the third insulating layer covering the etch stop layer and having a contact hole over the first side of the silicide layer; and forming a pixel electrode on the first side of the silicide layer and in contact with the first side of the silicide layer through the contact hole.

26. The method of claim 25, wherein the step of forming the third insulating layer forms the third insulating layer in contact with the etch stop layer and the first insulating layer.

27. The liquid crystal display device of claim 25, wherein the silicide layer includes tungsten.

* * * * *